(12) United States Patent
Hanan et al.

(10) Patent No.: US 7,399,719 B2
(45) Date of Patent: Jul. 15, 2008

(54) PROTECTION APPARATUS AND METHODS

(75) Inventors: Thomas Dixon Hanan, Mission Viejo, CA (US); Anthony E. B. Goodfellow, Long Beach, CA (US); David Lee Hanan, Virginia Beach, VA (US); Kathleen Elizabeth MacNeil, Irvine, CA (US)

(73) Assignee: Vaultstor Corporation, Newport Beach, CA (US)

( * ) Notice: Subject to any disclaimer, the term of this patent is extended or adjusted under 35 U.S.C. 154(b) by 710 days.

(21) Appl. No.: 11/065,100

(22) Filed: Feb. 24, 2005

(65) Prior Publication Data

US 2005/0185366 A1 Aug. 25, 2005

Related U.S. Application Data

(60) Provisional application No. 60/548,138, filed on Feb. 25, 2004.

(51) Int. Cl.
*G06N 5/00* (2006.01)

(52) U.S. Cl. ...................... 442/136; 521/123
(58) Field of Classification Search .............. 706/1; 521/123; 442/136; 252/62
See application file for complete search history.

(56) References Cited

U.S. PATENT DOCUMENTS

| | | | |
|---|---|---|---|
| 1,152,052 A | 8/1915 | Rubert et al. | |
| 3,559,594 A | 2/1971 | Miller | |
| 3,923,674 A * | 12/1975 | Shannon | 252/62 |
| 4,063,595 A | 12/1977 | Phillips | |
| 4,495,780 A | 1/1985 | Kaneko et al. | |
| 4,572,862 A * | 2/1986 | Ellis | 442/136 |
| 4,574,454 A | 3/1986 | Dyson | |
| 4,616,694 A | 10/1986 | Hsieh | |
| 4,645,613 A | 2/1987 | Harvey et al. | |
| 4,685,303 A | 8/1987 | Branc et al. | |
| 4,685,402 A | 8/1987 | Nelson et al. | |
| 4,694,119 A | 9/1987 | Groenewegen | |
| 4,708,970 A * | 11/1987 | Miranda | 521/123 |
| 4,831,476 A | 5/1989 | Branc et al. | |
| 5,069,358 A | 12/1991 | Avery, Jr. | |
| 5,208,728 A | 5/1993 | Schirmer | |
| 5,438,162 A | 8/1995 | Thompson et al. | |
| 5,457,603 A | 10/1995 | Leeb | |
| 5,508,922 A | 4/1996 | Clavelloux et al. | |
| 5,623,597 A | 4/1997 | Kikinis | |
| 5,708,565 A | 1/1998 | Fairbanks | |
| 5,810,919 A | 9/1998 | Olzak et al. | |
| 5,835,806 A | 11/1998 | Kautz | |
| 5,913,607 A | 6/1999 | Lengyel, Sr. | |
| 6,158,833 A | 12/2000 | Engler | |
| 6,289,678 B1 | 9/2001 | Pandolfi | |
| 6,365,244 B1 | 4/2002 | Ren et al. | |
| 6,736,473 B2 | 5/2004 | Cleveland et al. | |
| 2002/0036149 A1 | 3/2002 | Kwong | |
| 2002/0056713 A1 | 5/2002 | Rose | |
| 2004/0012316 A1 | 1/2004 | Davis | |

FOREIGN PATENT DOCUMENTS

| | | |
|---|---|---|
| DE | 4430549 A1 | 2/1996 |
| EP | 0875958 A1 | 11/1998 |
| GB | 2275354 A | 8/1994 |

* cited by examiner

*Primary Examiner*—Wilbert L Starks, Jr.
(74) *Attorney, Agent, or Firm*—Snell & Wilmer L.L.P.

(57) ABSTRACT

Methods and apparatus for providing environmental protection to electronic systems, particularly data storage systems, in order to permit such systems to survive severe envionmental changes such as those that occur during a fire.

17 Claims, 12 Drawing Sheets

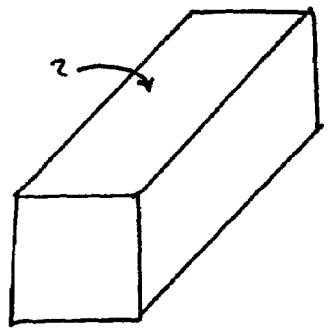
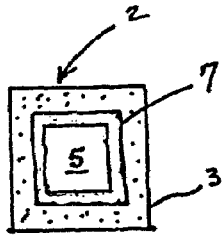
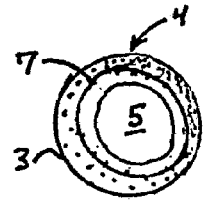
FIG 1.   FIG 2.   FIG 3.
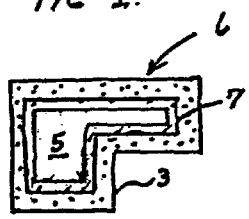
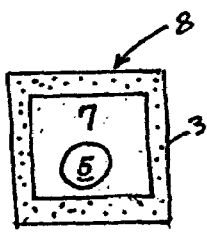
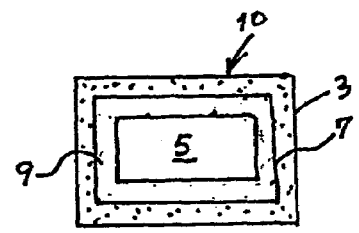
FIG 4.   FIG 5.   FIG 6.
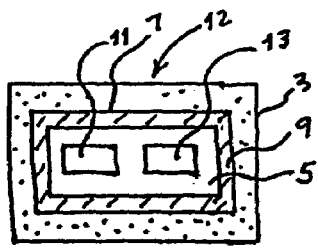
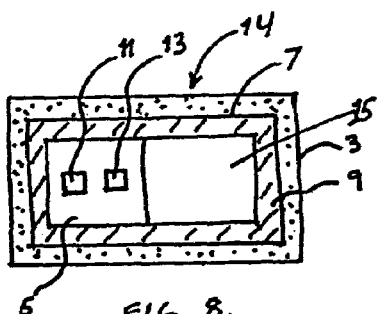
FIG 7.   FIG 8.
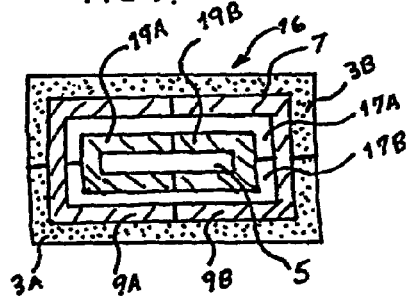
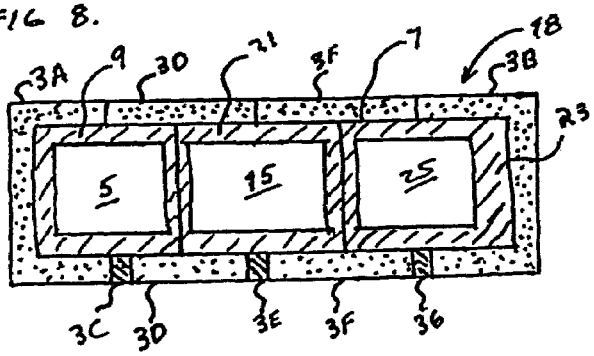
FIG 9.   FIG 10.

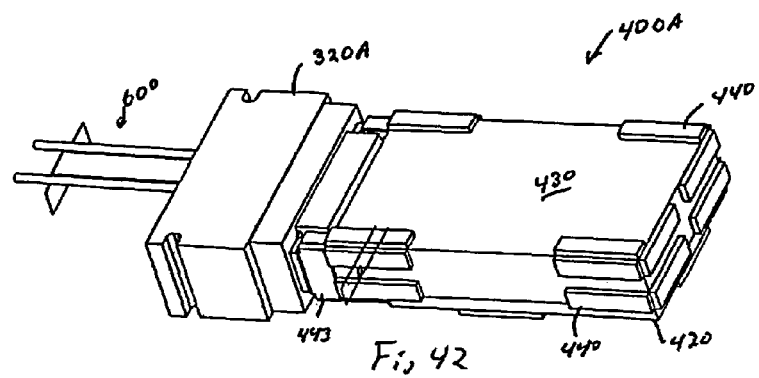
Fig. 42
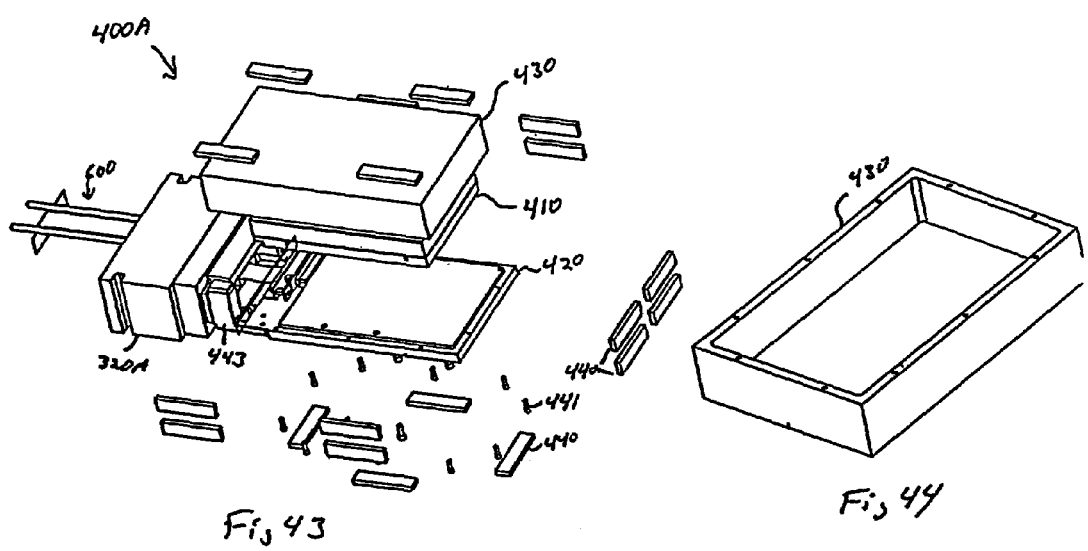
Fig. 43
Fig. 44
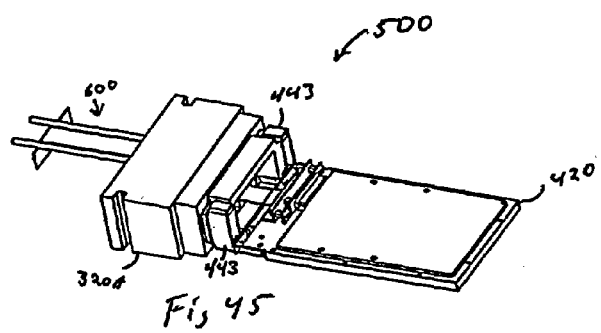
Fig. 45

| Formulas | M1 | M2 | |
|---|---|---|---|
| Typical Physical Properties | | | |
| Color | Cream with identifying marking | | |
| Maximum Use Limit | 2600°F (1462°C) | 3000°F (1649°C) | |
| Melting Point | 3165°F (1740°C) | 3400°F (1871°C) | |
| Nominal Density | 14-18 lb./cft. 220-290 kg/m3 | 14-18 lb./cft. 220-290 kg/m3 | |
| Typical Modulus of Rupture | | | |
| Green | 8.0x105N/m2 (115 lb/ft2) | 8.0x105N/m2 (115 LB/ft2) | |
| Fired | 3.8x105N/m2 (55 LB/ft2) | 3.8x105N/m2 (55 LB/ft2) | |
| Typical Chemical Analysis | | | |
| Al2O3 | 29% | 80% | |
| ZrO2 | 15% | - | |
| SiO2 | 56% | 20% | |
| Leachable Chlorides | < 15 ppm | < 15 ppm | |
| Linear Firing Shrinkage Temperature (soaking heat condition) | | | |
| | | 24 hrs. | 168 hrs. |
| 1343°C (2450°F) | <3.0% | 1.0% | 1.0% |
| 1427°C (2600°F) | N/A | 1.0% | 1.0% |
| 1482°C (2700°F) | N/A | 1.2% | 1.2% |
| Weight Loss on Ignition | 4-6% | 4-6% | |
| Compressive Strength Stress As Received | | | |
| 1.4x105N/m2 (20 LB/in2) | Deformation: 5% | Deformation: 5% | |
| 1.7x105N/m2 (25 LB/in2) | Deformation: 10% | Deformation: 10% | |

Figure 54

PROTECTION APPARATUS AND METHODS

CROSS-REFERENCES TO RELATED APPLICATIONS

This application claims the benefit of U.S. Provisional Application No. 60/548,138, filed Feb. 25, 2004, herein incorporated by reference in its entirety.

FIELD OF THE INVENTION

The present invention relates generally to environmental protection apparatus and methods. More particularly, it relates to methods and apparatus for protecting electronic storage devices from heat and water damage from residential and commercial fires.

BACKGROUND OF THE INVENTION

Protecting electronic systems, particularly data storage systems, from environmental changes is an ongoing concern. Numerous methods and apparatus exist for maintaining a proper operating environment. Such efforts include efforts for protecting such systems against, among others, changes in temperature and humidity, shock, and air pollutants.

Examples of previous attempts at providing such protection can be found at least in the following U.S. patents: U.S. Pat. No. 5,623,597, U.S. Pat. No. 6,158,833, U.S. Pat. No. 6,736,473, U.S. Pat. No. 4,831,476, U.S. Pat. No. 4,685,303, U.S. Pat. No. 5,457,603, U.S. Pat. No. 4,495,780, U.S. Pat. No. 6,289,678, U.S. Pat. No. 4,685,402, U.S. Pat. 4,574,454, U.S. Pat. No. 4,063,595, U.S. Pat. No. 4,616,694, U.S. Pat. No. 5,508,922, and U.S. Pat. No. 5,835,806. Unfortunately, previous attempts have not provided a solution that is adequate to all situations.

In many instances previous protection methods and apparatus result in electronic systems that are: (a) too costly in that they may cost ten times what an equivalent unprotected system would cost; (b) too bulky and/or heavy, and that need to be delivered and set up professionally; (c) too difficult to use in that they do not provide the same ease of use as do unprotected systems; and (d) too hard to market in that they cannot meet requirements of existing storage retailers. Moreover, in many instances such electronic systems cannot be operated continuously and either are not protected during operation, or can only be operated for limited periods of time.

SUMMARY OF THE INVENTION

The present invention is directed to methods and apparatus for providing environmental protection to electronic systems, particularly data storage systems, that permit such systems to survive severe environmental changes such as those that occur during a fire. Additionally, the methods and apparatus described herein provide a balanced approach in that such protection is obtained without an overly detrimental impact on cost, useability, connectability, portability or deliverability.

In at least some embodiments, the methods and apparatus described herein provide means of protection that result in apparatus that are lighweight and affordable. In some instances, embodiments weighing less than fifteen pounds and costing less than one hundred U.S. dollars are possible, thereby readily permitting individuals to purchase, transport, and use such embodiments.

In an exemplary embodiment of the invention, an apparatus comprises: a very low-k (very low thermal conductivity) shell having an interior cavity and an exterior surface; an electronic device enclosed within the interior cavity of the shell; and a first energy conduit extending between the interior cavity and the exterior surface, the energy conduit comprising a segment within a wall of the shell; wherein the segment of the first energy conduit within a wall of the shell changes at or after a time when a threshold temperature is met or exceeded in a manner that causes the thermal conductivity of the segment to decrease.

In another exemplary embodiment of the invention, an apparatus comprises a container including a cavity, the container including a first fiber based material loaded with a second material which endothermically decomposes above a pre-determined temperature T degrees Celsius where T is greater than 125 and less than 500.

In yet another exemplary embodiment of the invention, an apparatus comprises: a very low-k shell; and an electronic device within the shell; wherein the electronic device transmits and/or receives data and/or power signals through the shell using an optical wave guide and/or a time varying electromagnetic field.

In still another exemplary embodiment of the invention, an apparatus comprises: a very low-k shell; and an electronic device within the shell that utilizes energy obtained from outside the shell; wherein at least a portion of the energy used by the electronic device enters the shell without traveling along an electrical conductor extending between the inside and the outside of the shell.

In another exemplary embodiment of the invention, a flex circuit comprises: a first conductor; a second conductor; and a thermally tuned coupling material electrically connecting the first conductor to the second conductor; wherein the thermally tuned material breaks the electrical connection between the first conductor and the second conductor when a threshold temperature is met or exceeded.

In yet another exemplary embodiment of the invention, an apparatus comprises a flex circuit, the flex circuit including a plurality of electrical conductors where a first of the plurality of electrical conductors comprises at least a first and a second elongated segment, and a first connecting segment wherein the first connecting segment electrically connects the first and second elongated segments, and the first connecting segment has a melting point substantially below that of the first and second elongated segments.

In still another exemplary embodiment of the invention, an apparatus comprises: passive means for interrupting the flow of a working fluid into and out of a low-k shell enclosing an electronic device in response to a change in temperature.

Other exemplary embodiments of the invention are shown and described herein.

BRIEF DESCRIPTION OF THE DRAWINGS

The exact nature of this invention, as well as the objects and advantages thereof, will become readily apparent from consideration of the following specification in conjunction with the accompanying drawings in which like reference numerals designate like parts throughout the figures thereof and wherein:

FIG. 1 is a perspective view of an electronic fire brick (EFB) in accordance with an exemplary embodiment of the invention.

FIG. 2 is a cross-sectional view of the EFB of FIG. 1.

FIG. 3 is a cross-sectional view of another EFB in accordance with an exemplary embodiment of the invention.

FIG. 4 is a cross-sectional view of another EFB in accordance with an exemplary embodiment of the invention.

FIG. 5 is a cross-sectional view of another EFB in accordance with an exemplary embodiment of the invention.

FIG. 6 is a cross-sectional view of another EFB in accordance with an exemplary embodiment of the invention.

FIG. 7 is a cross-sectional view of another EFB in accordance with an exemplary embodiment of the invention.

FIG. 8 is a cross-sectional view of another EFB in accordance with an exemplary embodiment of the invention.

FIG. 9 is a cross-sectional view of another EFB in accordance with an exemplary embodiment of the invention.

FIG. 10 is a cross-sectional view of another EFB in accordance with an exemplary embodiment of the invention.

FIG. 42 is perspective view of a sub-assembly of the apparatus of FIG. 32.

FIG. 43 is an exploded view of the sub-assembly of FIG. 42.

FIG. 44 is a perspective view of a cover of the sub-assembly of FIG. 42.

FIG. 45 is a perspective view of a sub-assembly of the apparatus of FIG. 32.

FIG. 54 is a table presenting characteristics of preferred low-k materials.

DETAILED DESCRIPTION OF THE PREFERRED EMBODIMENTS

Figure 11:
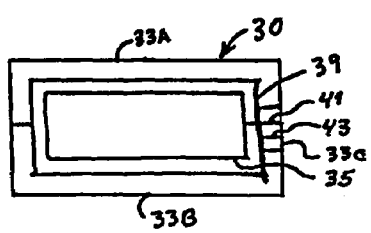
FIG. 11 is a cross-sectional view of another EFB in accordance with an exemplary embodiment of the invention.

Reference will now be made to the preferred embodiments of the invention, examples of which are illustrated in the accompanying drawings. While the invention will be described in conjunction with the preferred embodiments, it will be understood that these embodiments are not intended to limit the invention. On the contrary, the invention is intended to cover alternatives, modifications and equivalents, which may be included within the spirit and scope of the invention as defined by the appended claims.

In the following detailed description, numerous specific details are set forth in order to provide a thorough understanding of the present invention. However, it will be understood by one of ordinary skill in the art that the present invention may be practiced without these specific details. In other instances, well known methods, procedures, components, and circuits have not been described in detail so as not to unnecessarily obscure the important aspects of the present invention.

The methods and apparatus described herein are directed to protecting electronic systems (or any other system that generates heat during operation) against numerous environmental changes, but are particularly well suited for protecting against the changes that occur during a fire. Such systems may include, among others, storage units, control units and central processing units (CPUs), and are particularly beneficial when the systems protected include irreplaceable data, are costly, or are not readily reproduced. For simplicity, most of the discussion herein will be in regard to storage systems but will generally be equally applicable to other electronic and/or heat generating systems.

The primary environmental change protected against is change in temperature, with protection coming initially by encapsulating an electronic system within a container formed from a material having an extremely low thermal conductivity. This is illustrated in FIGS. 1 and 2 wherein a "electronic fire brick" (EFB) 2 comprises a shell/container 3, and an electronic data storage system 5 enclosed within a cavity 7. As used herein, EFBs are electronic systems encapsulated within a "low-k" material having an extremely low thermal conductivity, high heat capacity and high density, i.e. less than 1 w/mK thermal conductivity, effective heat capacity greater than 70 JkgK and density greater than 200 kg/m$^3$. Encapsulated, as the term is used in regard to EFBs, indicates at least 95% of the surface of the cavity 7 containing the electronic system 5 (excluding areas occupied by tubes, conductors, etc. that pass through the surface) is formed from the low-k material.

Although protection by encapsulation is not altogether unknown, it is contemplated that use of the materials described herein for that purpose are unique and non-obvious, both in regard to formulation, in regard to how encapsulation is accomplished, and in regard to how use of such materials contributes to protection against other environmental changes. More particularly, it has been found that the use of alumina-silica based ceramic fiber as an encapsulation material provides numerous benefits. In some embodiments, a bio-soluble material such as ISOFRAX, INSULFRAX, SF-607, or SF-607MAX, will be chosen in part because it is designed to dissolve in the lungs in order to avoid any potential health risks that insoluble fiber based materials might otherwise have.

One such benefit is that rigidity and abrasion resistance of alumina-silica based ceramic fiber can be adjusted while maintaining a desirably low thermal conductivity. As a result, it can be obtained either in a rigid form such that a container can be pieced together, or can be obtained in a "blanket" form that facilitates molding the material into a desired form. Another benefit is that once a container is formed from alumina-silica based ceramic fiber, the container is rigid, and is very resistant to deformation. As such, it protects an encapsulated system from being crushed or otherwise damaged should a wall, ceiling, or other structure collapse on it. Similarly, a comparatively high modulus of rupture also helps protect the encapsulated system. Yet another benefit is that the material is relatively impermeable. This allows it to provide some protection against damage from water, gasses, or other pollutants. Another benefit is the relative ease and cost efficiency with which such materials can be formed into complex shapes such as those desirable when encapsulating electronic and electromechanical units. Still another benefit is that the material has a relatively low linear firing shrinkage temperature which facilitates sizing a container just large enough to enclose the system being encapsulated and helps prevent subsequent problems that shrinkage might cause.

In preferred embodiments, the fiber based material used will be low cost, easy to manufacture, light weight, bio-soluble, have extremely low-k, while at the same time having very high capacity to absorb heat. As such suitable materials like those in the same family described in FIG. 54 already exhibit extremely low-k, low cost, easy manufacture, light weight, and bio-solubility. The thermal capacity of such fiber based materials can be further enhanced by adding hydroxides including by example, $Mg(OH)_2$ and or $Ca(OH)_2$ which endothermicaly change chemical composition at an adjustable temperature, thereby substantially increasing the thermal capacity of the fiber based material. Increasing the thermal capacity of the fiber based material significantly reduces the size and thereby increases the usability of the EFB.

In some embodiments the low-k thermal stability of such fiber based materials can be further enhanced by adding materials such as carbon which maintain their physical integrity at extremely high temperatures by changing their molecular structure thereby increasing their strength and or decreasing their thermal conductivity.

In some embodiments the material used to form an encapsulating container will use a low-k material where additional endothermic materials, having enthalpy of decomposition of 250 to 400 Cal/g and preferably 270 to 330 Cal/g, have been loaded into the low-k material.

FIGS. 3-10 illustrate alternative forms of EFBs. As FIGS. 3 and 4 illustrate, the EFBs 4 and 6, the electronic systems 5, and/or the cavities 7 need not have the shape of a rectangular prism. Moreover, as illustrated with EFB 8 in FIG. 5, the volume and dimensions, of the cavities 7 need not closely match the volume and dimensions of the systems 5. As shown with EFB 10 of FIG. 6, the system 5 may be further encapsulated within another container 9 having a cavity 10. As shown with EFB 12 in FIG. 7, the electronic system 5 may comprise one or more sub-systems 11 and 13, or, as shown with EFB 14 in FIG. 8, an EFB 1 may encapsulate multiple electronic systems 5 and 15. In some embodiments an EFB may effectively encapsulate another EFB as illustrated by EFB 16 in FIG. 9, which also illustrates that the one or more containers may comprise multiple pieces. In FIG. 9, the EFB 16 includes an electronic system 5 encapsulated in a first container having pieces 19A and 19B, which is encapsulated in a second container having pieces 17A and 17B, which is encapsulated in a third container having pieces 9A and 9B, which is encapsulated in a fourth container having pieces 3A and 3B. In FIG. 10, an EFB 18 illustrates that an EFB may comprise a single, multi-piece low-k container (3A, 3B, 3C, 3D, 3E, 3F, and 3G) encapsulating a plurality of other containers 9, 21, and 23, each of which encapsulates an electronic system (5, 15, and 25). For container comprising multiple pieces coupled together, the same material or combination of materials may be used for every piece of a container, or may vary between pieces.

It is preferred that EFBs be able to withstand severe external forces without significantly deforming. More particularly, it is preferred that EFBs be able to withstand drops from specific heights onto specific materials as specified in existing and future industry and national fire protection standards such as but not limited to UL without deformation which would result in the device failing the test. Use of the previously described low-k materials for the external shell (3, 3A, 3B, etc.) facilitate formation of such EFBs, and in many instances allow formation with wall thicknesses less than or equal to 3.5 inches, and generally between 1.5 and 3 inches.

It is contemplated that smaller and lighter EFBs are in many instances preferable over larger and/or heavier EFBs. As such, it is contemplated that in some instances EFBs will fit within a spherical volume having a radius of R1 inches where R1 is one of 24, 12, 6, and 3, and/or will weigh less than W1 pounds where W1 is one of 150, 125, 100, 75, 50, 25, 10, and 5.

It is contemplated that resistance to deformation is also facilitated by encapsulating an electronic system within a rigid secondary container within the low-k shell as illustrated in FIGS. 6-10, particularly if the cavity 7 of the low-k shell is substantially the same size and shape of the exterior of the secondary container. As such, assembling, molding, and/or machining the low-k shell such that the size and shape of the cavity 7 conform to the exterior size and shape is particularly advantageous. It is also contemplated that resistance to deformation is also facilitated by encapsulating the low-k shell within another container, which preferably fits closely and possibly compresses the low-k container. As an example, the low k container having pieces 17A, and 17B in FIG. 9, are enclosed within container 9A and 9B. In some instances, the low-k container will be compressed between inner and outer containers. In other instances, the inner container will not provide much in the way of additional support and most of the resistance from deformation will come from a low-k shell encased in another container such as a low-k shell having a metal skin.

Container pieces may be coupled together in any manner, with the use of adhesive bonding and mechanical fasteners being two examples. For at least the low-k external shell it is preferred that any method used maintain the insulation and durability characteristics of the shell. Although external low-k shells may comprise any reasonable structure, it is preferred for ease of manufacturing and reduced cost that the number of different pieces used in forming a shell be minimized. Moreover, reducing the length and number of seams between pieces can improve the characteristics of the low-k shell. As such, it is contemplated that shells comprising two pieces, and/or shells comprising two identical pieces coupled together may prove advantageous. In some instances it is also advantageous to form low-k shell pieces such that they readily align with each other when being coupled together to form a low-k shell. As such, in some instances low-k shell pieces (and/or pieces used to form other containers within an EFB) will comprise protrusions, indentations, and/or indicators that facilitate coupling pieces together to form a low-k shell.

Unfortunately, encapsulating an electronic system within a low-k shell inhibits dissipation of heat generated by the electronic system. This is particularly problematic if an encapsulated system generates heat faster than it can be dissipated as, referring back to FIG. 2, the temperature within the cavity 7 of the shell 3 will continue to increase. As such, for continuous operation of the system 5, means for dissipating heat faster (at least on average) than it is generated is needed. Since the low-k materials described herein have an extremely low thermal conductivity, encapsulating almost any electronic system within such material will require such means for dissipating heat. Moreover, for a system 5 to function, it will generally need to be supplied with power, and will generally require means for communicating with one or more systems outside of the low-k shell 3.

Dissipating heat, transferring power, and communicating through the shell (hereinafter "energy transfers") can be accomplished in a variety of ways. Any such energy transfers can be accomplished in a manner that impacts the effectiveness of the low-k shell or in a manner that does not impact the effectiveness of the low-k shell. In many instances, it is preferred to utilize methods and apparatus that don't impact the low-k shell's effectiveness. As such, some embodiments will comprise one or more antenna's, inductive coils, and/or conductors positioned within the low-k shell 3, the cavity 7, or the system 5 to transmit or receive electromagnetic energy through the low-k shell 3. In some instances it may be possible to effect such transfers using waveguides that pass through the low-k shell 3, with waveguides that have a thermal conductivity and/or melting point similar to that of the low-k shell 3. In such instances, the waveguides can be left in place even during adverse conditions without having an excessively negative impact on the effectiveness of the low-k shell 3. However, in many instances such energy transfers will be accomplished using conductors, waveguides, conduits, etc. ("energy conduits") that have a negative impact on the effectiveness of the low-k shell, typically by having a higher thermal conductivity than the low-k shell. In such instances, it is preferably that the EFB have a first set of thermal characteristics (i.e. be in an "operating mode") during normal operation, i.e. when heat needs to be dissipated, and a second set of thermal characteristics (i.e. be in a "protection mode") during adverse conditions, i.e. during a fire. Stated another way, during normal operation, increased thermal conductivity via the energy conduits is allowed, but is not allowed when heat transfer into the cavity 7 is undesirable.

In some instances switching between an operating mode and a protection mode may be accomplished actively, i.e. using electronic sensors and an electronic controller or similar apparatus, or passively, i.e. as a result of physical change directly caused by a change in temperature or humidity. If active switching between modes is used, a controller could utilize an actuator to open a valve, break a connection, insert a thermal barrier, or take some other action that decreases the impact of the energy conduits on the effectiveness of the low-k shell when the EFB is in protection mode. In some instances, switching between the operating mode and the protection mode may be reversible, particularly if active switching is used.

Although reversibility and active switching is beneficial in some instances, it is contemplated that in other instances irreversible passive switching can provide a more reliable and cost effective solution without any significant loss in functionality. As an example, active switching may significantly increase the cost, weight or size of an EFB. As another example, active switching may have a higher likelihood of failing to protect the encapsulated unit if the controller fails before switching is accomplished. As yet another example, having to disassemble an EFB to regain access to a system it contains may be worthwhile if by doing so the likelihood of the system surviving can be significantly increased. Moreover, in the case of a fire, the structure and/or systems around the EFB will likely suffer significant damage so continued use of a system within the EFB will often require at least transportation and re-installation of the EFB.

Figure 12:
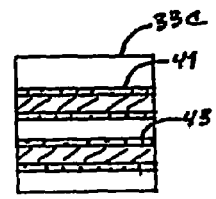
FIG. 12 is a cross-sectional view of an EFB plug in operating mode in accordance with an exemplary embodiment of the invention.

In FIG. 11, an EFB 30 includes a low-k shell comprising pieces 33A, 33B, and 33C, an internal container 39, an electronic system 35, and energy conduits 41 and 43. For discussion, the conduit 41 will be assumed to be an insulated conductor passing through the low-k shell "plug" piece 33C and the container 39 to the system 35, and the conduit 43 a tube through which a working fluid flows when flowing between the container 39 and the exterior of the EFB 30. FIG. 12 provide a detailed view of the plug 33C and the energy conduits 41 and 43 as they might appear during normal operation.

Figure 13:
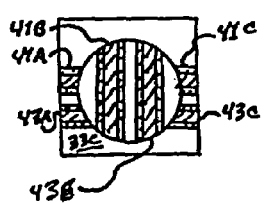
FIG. 13 is a cross-sectional view of an EFB plug in protection mode in accordance with an exemplary embodiment of the invention.
Figure 14:
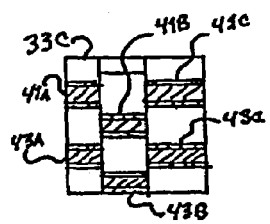
FIG. 14 is a cross-sectional view of an EFB plug in protection mode in accordance with an exemplary embodiment of the invention.

It is contemplated that switching between the operating mode and the protection mode may be accomplished by passive or active means within the plug 33C. As an example, segments of the energy conduits may be offset from other segments of the conduit by rotating segments as illustrated by FIG. 13, and/or by translating segments as illustrated by FIG. 14. Translation and/or rotation are can be accomplished either actively, i.e. with an actuator moving a portion of the plug 33C, or passively such as by a change in material size and/or shape in response to a temperature change.

Figure 15:
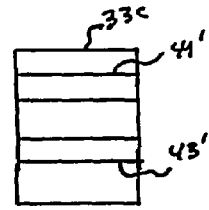
FIG. 15 is a cross-sectional view of an EFB plug in protection mode in accordance with an exemplary embodiment of the invention.
Figure 16:
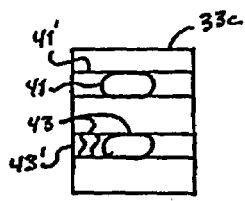
FIG. 16 is a cross-sectional view of an EFB plug in protection mode in accordance with an exemplary embodiment of the invention.
Figure 17:
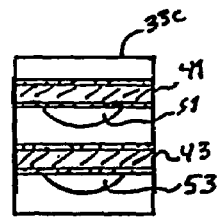
FIG. 17 is a cross-sectional view of an EFB plug in operating mode in accordance with an exemplary embodiment of the invention.
Figure 18:
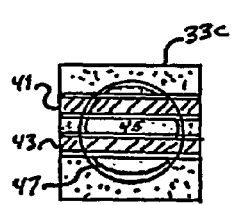
FIG. 18 is a cross-sectional view of an EFB plug in operating mode in accordance with an exemplary embodiment of the invention.
Figure 19:
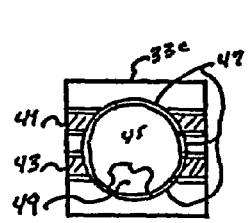
FIG. 19 is a cross-sectional view of the EFB plug of FIG. 18 in protection mode.
Figure 20:
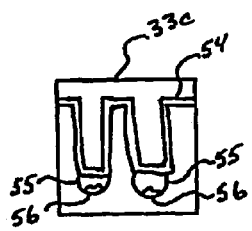
FIG. 20 is a cross-sectional view of an EFB plug in operating mode in accordance with an exemplary embodiment of the invention.
Figure 21:
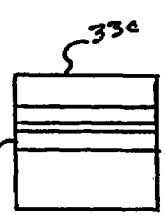
FIG. 21 is a cross-sectional view of an EFB plug in operating mode in accordance with an exemplary embodiment of the invention.
Figure 22:
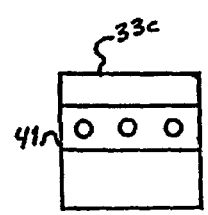
FIG. 22 is a cross-sectional view of the EFB plug of FIG. 21 in protection mode.
Figure 23:
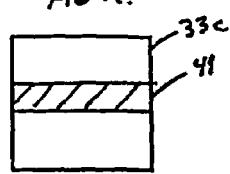
FIG. 23 is a cross-sectional view of an EFB plug in operating mode in accordance with an exemplary embodiment of the invention.
Figure 24:
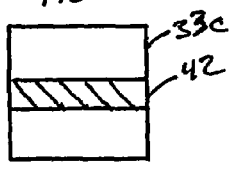
FIG. 24 is a cross-sectional view of the EFB plug of FIG. 23 in protection mode.

FIGS. 15-20 provides examples of plug 33C incorporating passive switching means. In FIG. 15, the energy conduits burn, melt, or otherwise change state leaving two open channels 41' and 43'. In FIG. 16, the energy conduits 41 and 43 undergo a change in volume within the channels 41' and 43' leaving the channels 41' and 43' open in places, and possible plugged in places. In FIG. 17, a plug 33C is shown with cavities 51 and 53 that material from the energy conduits 41 and 43 can flow into. In FIG. 18, during operating mode, the energy conduits 41 and 43 pass through a cavity 45 at least partially lined by a tube 47. In FIG. 19, a passive switch to protection mode results from at least the center portions of the energy conduits 41 and 43 melting into a mass 49 in the cavity 45 lined by tube 47. In FIG. 20, a plug 33C comprises a channel 54 which is an "arduous path" (i.e. comprises at least one bend and is significantly longer than the minimum length required to pass through the plug 33C), and includes cavities 55 and the remains of an energy conduit as masses 56. Such cavities 55 are preferably sized to reduce the likelihood of convection currents thereby reducing heat transfer. In FIGS. 21 and 22, a passive switch between modes has a conduit 41 in a plug 33C changing structure such that an electrically and thermally conductive material within an insulator converts to a plurality of globules encapsulated within an expanded form of the insulator. In FIGS. 23 and 24, a conduit 41 changes chemically to a plug 42 that provides better insulation than it did as prior to the change.

It is contemplated that in some instances an energy conduit may comprise multiple switching means for changing between an operating mode and a protection mode. In some instances, such switching means may be configured to switch under the same set of conditions while in others they may be activated by different sets of conditions. As an example, an energy conduit might comprise an electrical path formed by serially connecting three separate conductors using a first connecting material between a first conductor and a second conductor, and a second connecting material between the second conductor and a third conductor. In such an instance, the first connecting material may be design to disconnect the conductors it is connecting if a first temperature is exceeded, while the second connecting material does the same thing at the same or when a second temperature is exceeded.

Figure 25:
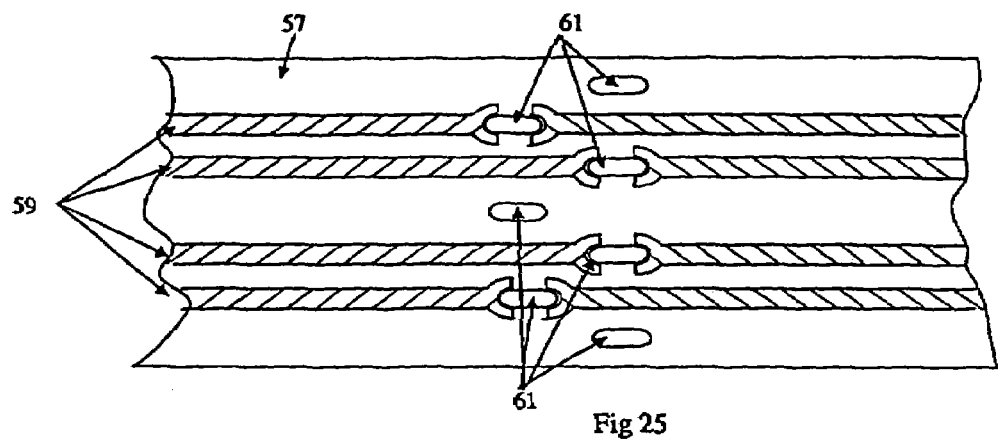
FIG. 25 is a top cross sectional view of a flex circuit with discontinuous conductive paths in accordance with an exemplary embodiment of the invention.
Figure 26A:
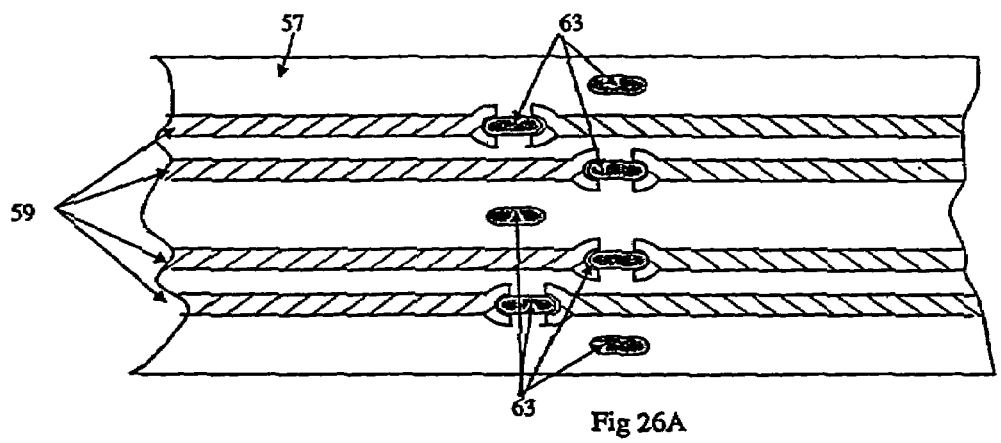
FIG. 26A is a top cross sectional view of the flex circuit of FIG. 25 with continuous conductive paths.
Figure 26B:
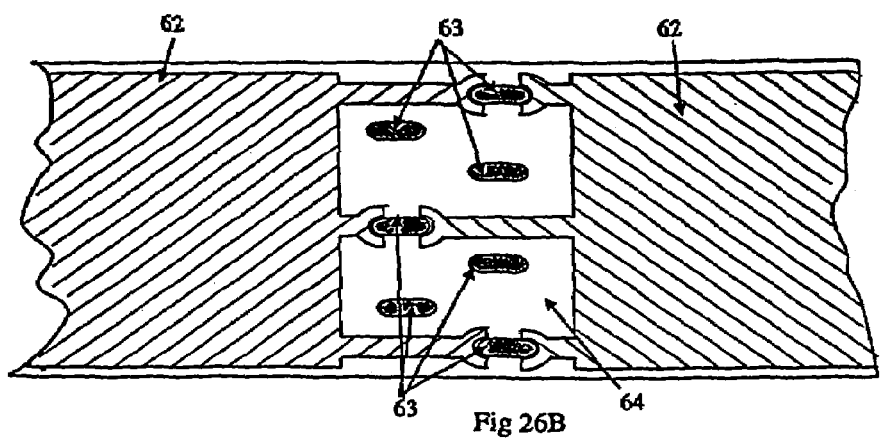
FIG. 26B is a bottom cross sectional view of the flex circuit of FIG. 26A.

In some instances a plurality of energy conduits, particularly electrical conductors, may be grouped together. In FIGS. 25 and 26A, a portion of a flex circuit 57 is shown that includes conductors 59. In forming the flex circuit, the conductors 59 are broken by gaps 61 (possibly by punching, drilling or molding a gap 61 through the circuit), and then filled by a conductive material 63 as shown in FIG. 22. In FIG. 26B, ground plane segments 62 are separated by a gap 64 that is partially bridged by material 63. By proper selection of the material 63, and the dimensions of the gap 61, temperature changes can cause the material 63 to flow away from the conductors 59, or to undergo some other change that decreases the rate at which heat can flow through the flex circuit 57. As with FIGS. 18 and 19, in some instances the flex circuit may pass through a cavity 55 into which the material 63 can flow. By example the melting point of material 63, the dimensions of gap 61 and the thickness of circuit 57 should be chosen such that the force exerted by gravity on the material 63 shall be greater than the surface tension of the material 63 at or above the desired temperature at which it will be pulled away from gap 61 and into the available cavity. Further, heat flow is reduced by selecting a base material for circuit 57 which melts into the cavity 55 at a suitable low temperature to prevent heat conduction via the base material of the circuit 57.

In embodiments providing cavities into which material can flow, it is preferably if the cavities extend completely around the material that is expected to flow to allow proper flow regardless of current orientation. As an example, having a cavity positioned on one side of an energy conduit provides little benefit if the cavity is positioned above the conduit when it is needed.

It is contemplated that having energy conduits flow through a plug in the low-k shell has at least two advantages. One advantage is that plugs can be used to customize shells to particular application. In such instances, most of the shell can have a generic shape and can be manufactured in bulk, and the plugs used to provide necessary energy conduits. Another advantage is that if passive switching is used, it may not be necessary to fully uninstall an encapsulated electronic system to obtain access to any data it contains, and/or to continue using it. Instead the plug may be removed to provide access, and/or replaced to provide for continued operation.

Figure 27:
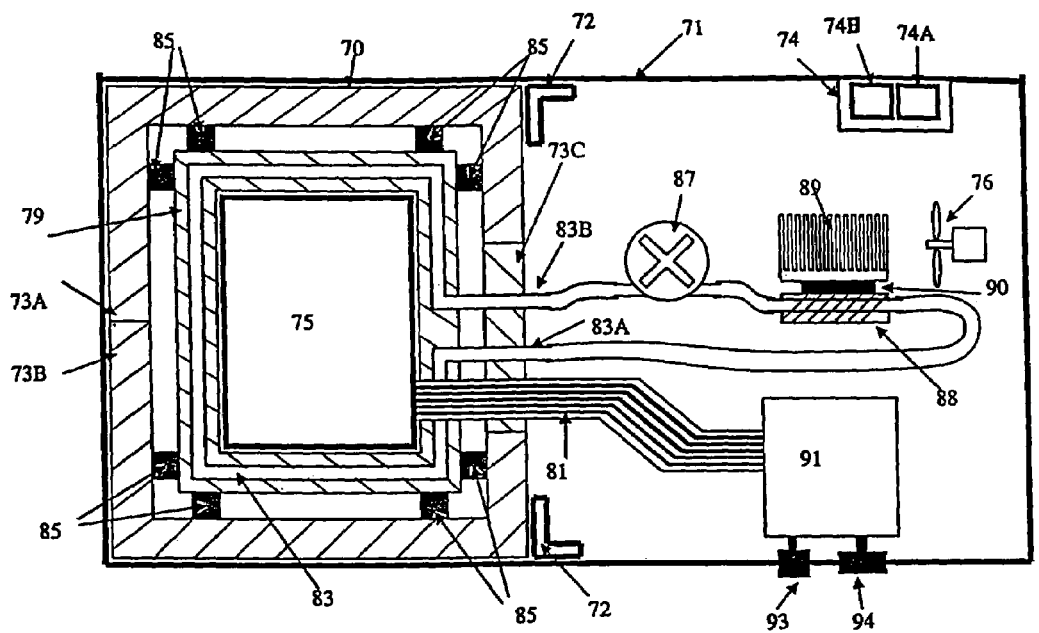
FIG. 27 is a schematic cross-sectional view of an environmental protection system in accordance with an exemplary embodiment of the invention.

In some instances an energy conduit may be a path through which a working fluid used to transfer heat away from an encapsulated electronic system may flow. In some instances, the fluid may flow through the electronic system, while in others it may flow through a thermal mass such as a metal plate positioned within the cavity formed by the low-k shell. In FIG. 27, an environmental protection system 71 includes an EFB 70 within a compression case 72. The EFB 70 comprises a low-k shell having pieces 73A, 73B and 73C with 73C being a plug through which energy conduits 81, 83A and 83B pass with conduit 81 being an electrical conductor, and conduits 83A and 83B being tubes providing flows paths for a working fluid. The EFB 70 further comprises a metal container 79, an electronic system 75, and shock absorbing mounts 85. The metal container 79 is a thermal mass having a channel 83 through which a working fluid can flow to transfer heat from the container 79 to the exterior of the EFB 70. Outside of the EFB 70 but within the case 72, a pump 87 functions to keep the working fluid flowing through the container 79 and an external active cooling system that includes a thermal mass 88, an active cooler 90, a heat-sink 89, and a cooling fan 76 that transfers heat out of the case 72 via air movement across the heat-sink 89. A data interface/power supply unit(s) 91 provides necessary interfaces between the EFB 70 and external power 93 and data 94 apparatus.

The active cooler 90, one example of which is a Peltier device, is used to transfer heat from the thermal mass 88 to the heat-sink 89, and to keep the temperature of the heat-sink 89 substantially above the ambient temperature to increase its effectiveness. The active cooling device 90 can also be used to cool the thermal mass 88 below the external ambient temperature in order to drop the temperature of the container 79, and the electronic system 75, thereby providing increased protection as the container 79 and electronic system 75 can absorb more heat before incurring damage. As such, it is contemplated that in some embodiment the electronic system may be maintained at a temperature at or just above its minimal safe operating temperature. If the electronic system 75 is not always in used, it may be kept at or just above its minimal safe storage temperature until it is used, then brought up to its minimal safe operating temperature for use, and then dropped back down to its minimal safe storage temperature when not in use. In such an embodiment, maximum protection will be obtained during both use and non-use.

The system 71 also include an environmental monitoring module 74 having a temperature monitor 74A and a shock monitor 74B. The modules 74A and 74B are preferably non-powered passive devices that undergo a detectable chemical change (possibly a color change) if the system 71 is subjected to a temperature or shock that exceeds a recommended level. This monitoring module 74 is not intended to identify shock or temperature conditions that occur during a fire, but rather to indicate when excessive temperature or shock occurs during shipping, storage, or what is asserted to be normal operating conditions.

It is important to note the shock/vibration absorbing mounts 85 of the EFB 70. Although the use of shock absorbing mounts is not unknown, the mounts 85 are positioned within the low-k shell rather than to the exterior of the low-k shell. As such, the mounts 85 will continue to function even if the EFB 70 is subjected to extreme temperatures. Moreover, the mounts 85 may provide an insulating air gap between the container 79 and the low-k shell.

The use of a container, such as the container 79, within the low-k shell can provide numerous advantages. One such is that, as previously discussed, it can increase the strength and durability of the EFB. Another is that it can further protect the system 5 from environmental changes, particularly if the container 79 is hermetically sealed and has a dry interior. In some instances it may be filled with a gas such as nitrogen having a low relative humidity such that damage to system 75 from condensation shall not occur. Still another is that it provides a convenient mechanism for mounting different types of systems within a generic EFB, and particular provides a mechanism for shock mounting that doesn't require connection of such mounts directly to such systems. Yet another is that it can simultaneously function as a thermal mass to minimize the maximum temperature experienced by system 75.

It is contemplated that in some instances the EFBs controller 91 will be adapted to switch between operating and protection modes when a pre-determined temperature internal or external to the low-k shell is reached. In other instances, the switch may occur when the heat begins accumulating inside the low-k shell at a faster rate than it can be dissipated. In still other instances, the switch may occur if the rate at which heat is dissipated drops below a pre-determined value. In other instances, the switch may occur in response to a signal being sent from an external source to the EFB, or in response to some other triggering event other than a temperature change.

It is contemplated that in some instances EFBs may be incorporated into or coupled to an enclosure that includes a power supply, a working fluid pump, a thermal mass/heatsink, and a data interface. In some instances it may function as a standalone system while in others it may be part of a larger standalone system of which the EFB is a sub-system.

Figure 28:
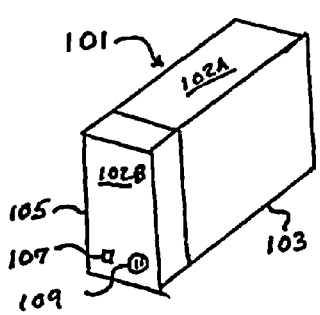
FIG. 28 is a perspective view of an apparatus in accordance with an exemplary embodiment of the invention.
Figure 29:
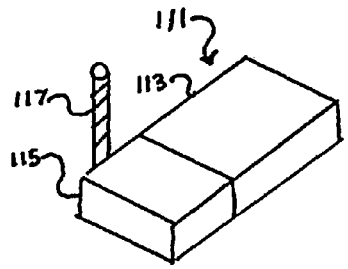
FIG. 29 is a perspective view of an apparatus in accordance with an exemplary embodiment of the invention.
Figure 30:
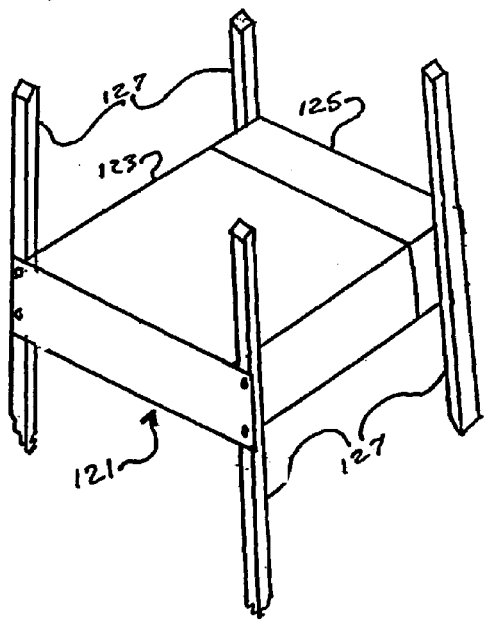
FIG. 30 is a perspective view of an apparatus in accordance with an exemplary embodiment of the invention.
Figure 31:
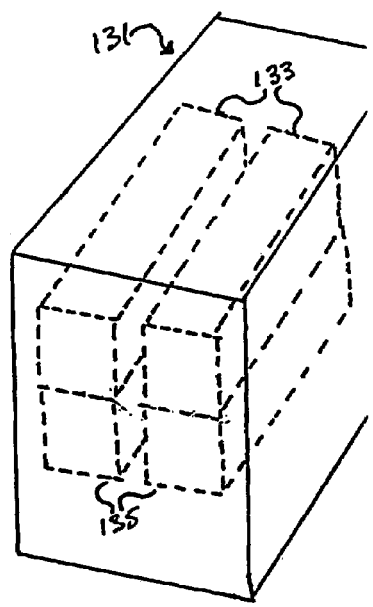
FIG. 31 is a perspective view of an apparatus in accordance with an exemplary embodiment of the invention.

As an example, FIG. 28 illustrates a storage apparatus 101 comprises an EFB 103 and a support module 105 having a data connector 107 and a power connector 109. The module 105 might include a working fluid pump if such a pump was not included within the EFB 103, and would likely include a thermal mass for dissipating heat, active thermoelectric component(s) to improve heat dissipation efficiency, a power supply for converting utility supplied power to a form useable by the EFB 103, and data interface(s) that provides a mechanism by which data and commands can be communicated to and from the EFB 103. the apparatus 101 includes two enclosures 102A and 102B, one for the EFB 103 and one for the support module 105. However, the two enclosures could in alternative embodiments be different portions of a single enclosure. The apparatus 101 has a tower configuration. As another example, in FIG. 29, a portable apparatus 111 comprises an EFB 113 and a support module 115. The support module includes an antenna 117 and the circuitry necessary to provide wireless communication capability to the EFB 113. As yet another example, FIG. 30 illustrates an apparatus 121 comprising an EFB 123, a support module 125 coupled to the EFB 123, and a rack 127 supporting the EFB 123 and the support module 125. Also, in FIG. 31, and apparatus 131 includes sub-systems 133 and 135 where sub-systems 133 are EFBs, and sub-systems 135 are support modules.

Figure 32:
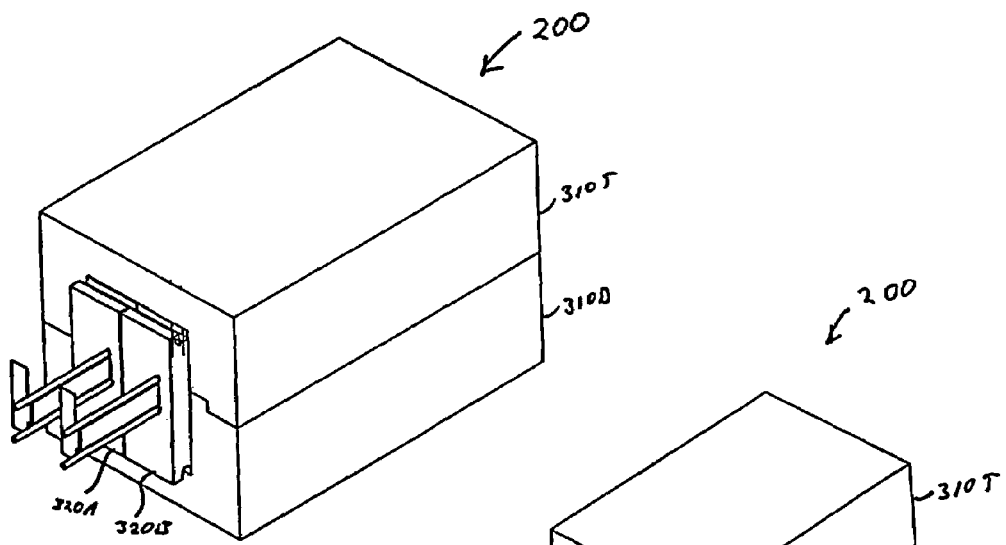
FIG. 32 is a perspective view of an apparatus in accordance with an exemplary embodiment of the invention.
Figure 33:
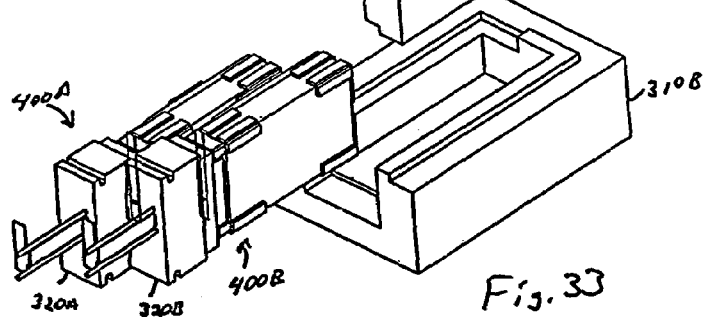
FIG. 33 is an exploded view of the apparatus of FIG. 32.
Figure 34:
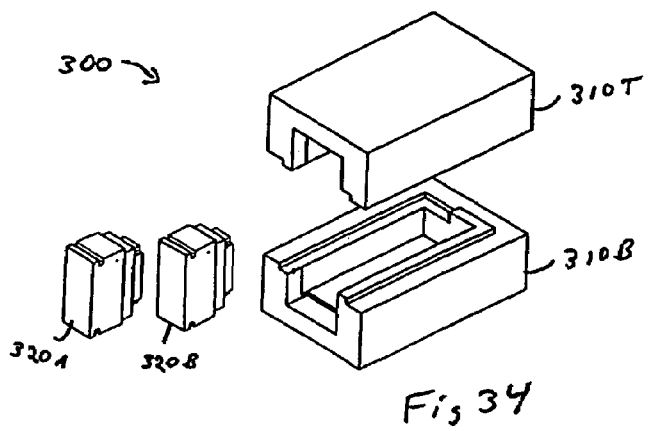
FIG. 34 is an exploded view of a low-k shell of the apparatus of FIG. 32.
Figures 35, 36, 37:
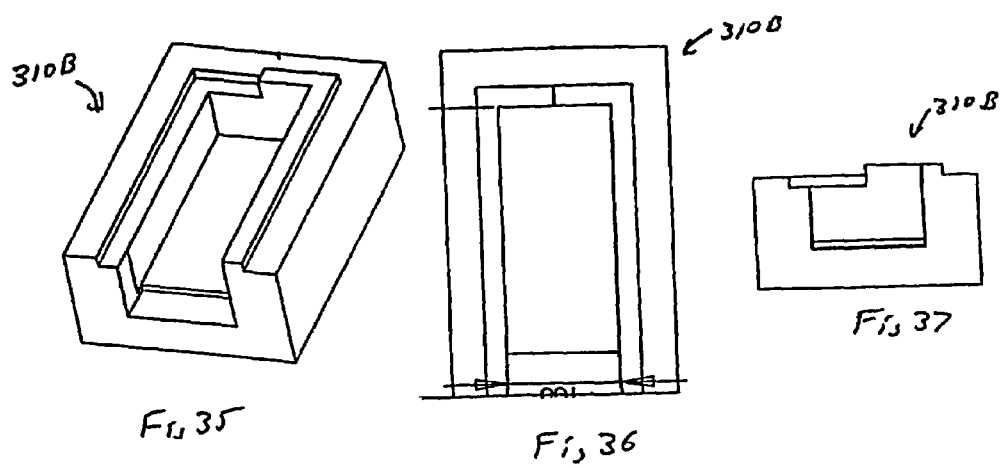
FIG. 35 is perspective view of a piece of the enclosure of FIG. 34.
FIG. 36 is a top view of the piece of enclosure of FIG. 35.
FIG. 37 is an end view of the piece of enclosure of FIG. 36.
Figures 38, 39, 40, 41:
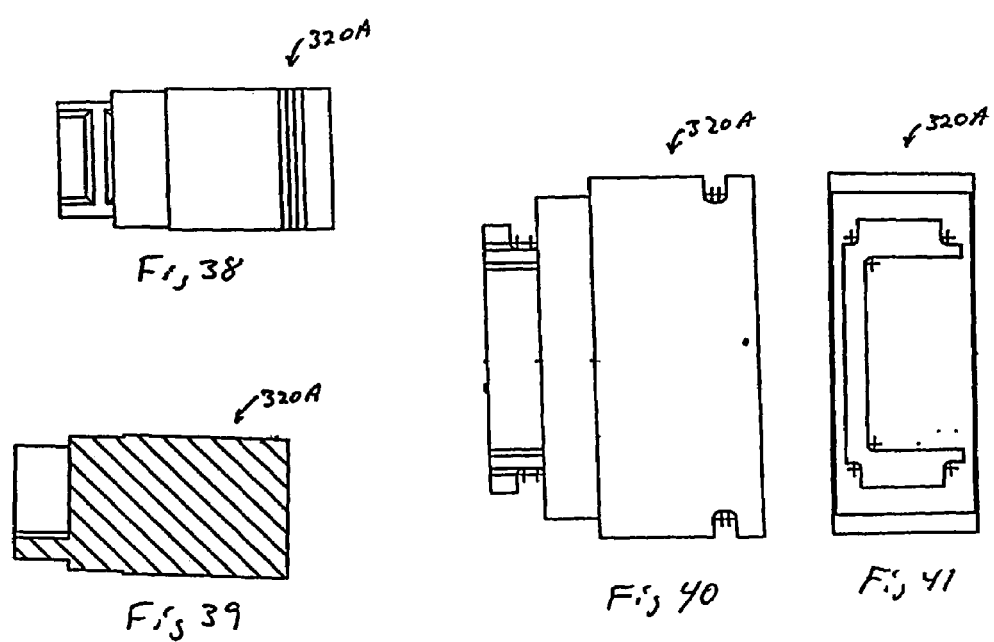
FIG. 38 is a side view of a plug of the enclosure of FIG. 34.
FIG. 39 is a side cross-sectional view of the plug of FIG. 38.
FIG. 40 is a top view of the plug of FIG. 38.
FIG. 41 is a front view of the plug of FIG. 38.

FIGS. 32 to 52 describe a preferred EFB 200. As best shown in FIG. 32-34, the EFB 200 includes cooled data modules 400A and 400B enclosed within a low-k shell 300.

As best shown in FIGS. 34-41 the low-k shell 300 includes a vacuum formed top half 310T and a vacuum formed bottom half 310B which are identical to each other, as well as plugs 320A and 320B that are also identical to each other and are part of the data modules 400A and 400B respectively.

The data modules 400A and 400B are, in the embodiment shown, identical to each other. As such, description of both data modules will be given by describing module 400A. As best shown in FIGS. 42 and 43, the cooled data module 400A includes disk drive 410, a cooling plate 420, a cover 430, shock absorbing members 440, fasteners 441, brackets 443, an energy conduit assembly 600, and a plug 320A. The cover 430 is shown alone in FIG. 44.

Figure 46:
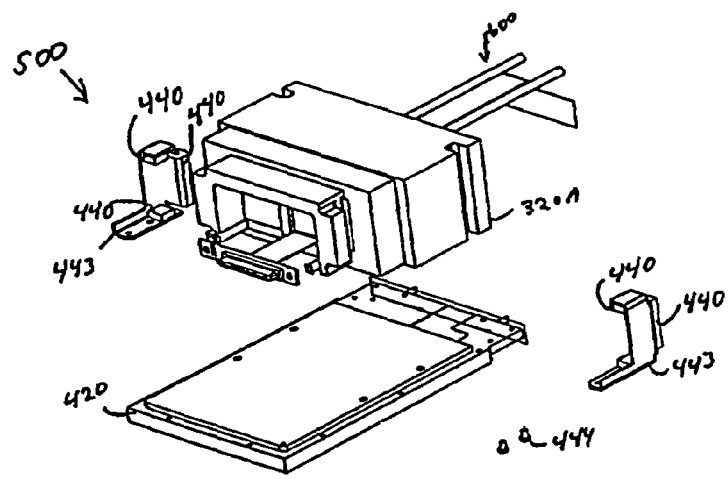
FIG. 46 is an exploded view of the sub-assembly of FIG. 45.
Figure 47:
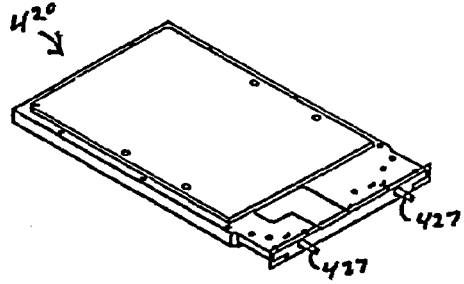
FIG. 47 is a perspective view of a cooling plate of the sub-assembly of FIG. 45.
Figure 48:
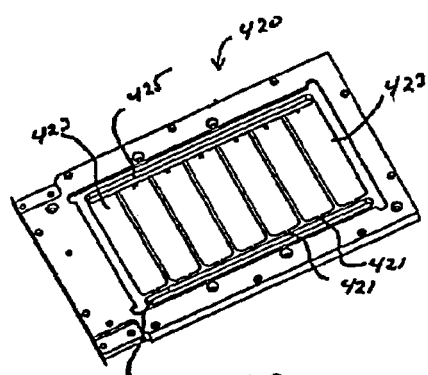
FIG. 48 is a perspective view of a cooling plate of the sub-assembly of FIG. 45 with its interior exposed.

As best shown in FIGS. 45-46, the cooled data module 400A includes an interface sub-assembly 500 that includes the energy conduit assembly 600, the plug 320A, the brackets 443, bracket fasteners 444, and cooling plate 420. The cooling plate 420 is also illustrated in FIGS. 47-48, and includes machined out areas through which a working fluid (not shown) can flow. More particularly, it includes manifolds 425, inlets 421, and low flow areas 423. The manifolds 425 are coupled to an external source of pumped working fluid, through pipes 427, such that fluid flows into a first manifold 425, is distributed to the low flow areas 423 by half of the inlets 421, exits the low flow areas 423 by the other half of the inlets 421, and flows out of the cooling plate 420 via the second manifold 425.

Figure 49:
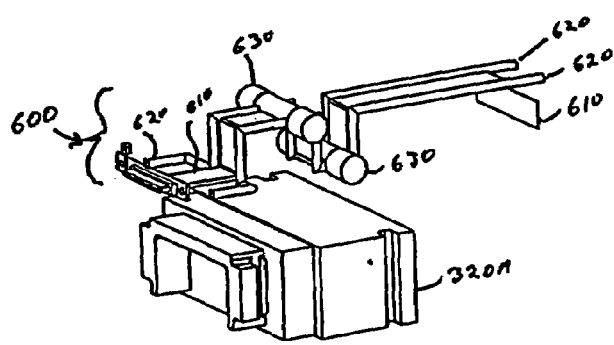
FIG. 49 is an exploded perspective view of a plug and a conduit assembly of the sub-assembly of FIG. 45.
Figure 50:
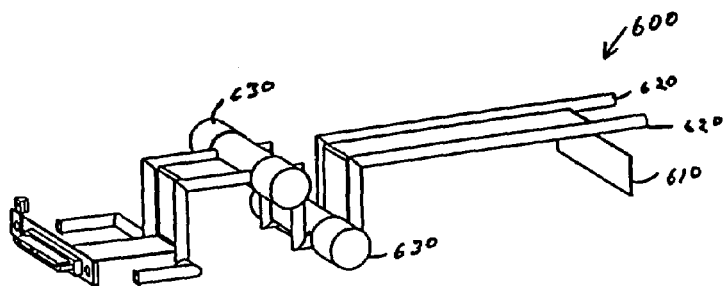
FIG. 50 is a perspective view of the conduit assembly of FIG. 49.
Figure 51:
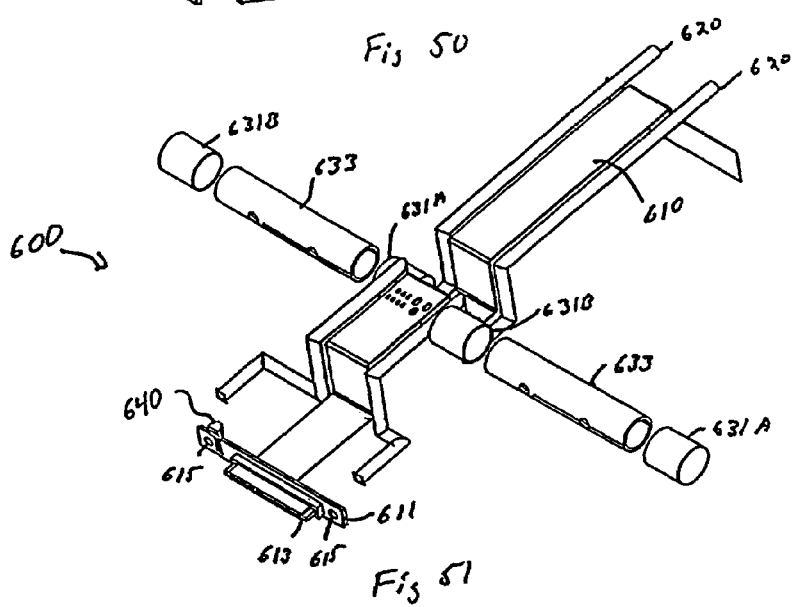
FIG. 51 is an exploded perspective view of the conduit assembly of FIG. 50.

As best illustrated by FIGS. 49-51, the energy conduit assembly 600 includes a flex circuit 610, working fluid tubes 620, and cavity liners 630. The flex circuit 610 provides a mechanism by which electrical signals, including data and power signals, can pass through the low-k shell 300. The working fluid tubes 620 provide paths by which a working fluid can flow into and out of the low-k shell 300. The cavity liners 630 each include tubes 633 and end caps 631A and 631B and function to define an enclosed but open space around the flex circuit 610 and the working fluid tubes 620. The energy conduit assembly 600 is preferably molded into the plug 320A. The cavity liners 630 are necessary as it is desirable to maintain such open spaces when the energy conduit assembly is molded into the plug 320A. In FIG. 49, the conduit assembly 600 is positioned above the plug to illustrate how it and the plug 320A are aligned when it is molded into the plug 320A.

Figure 52:
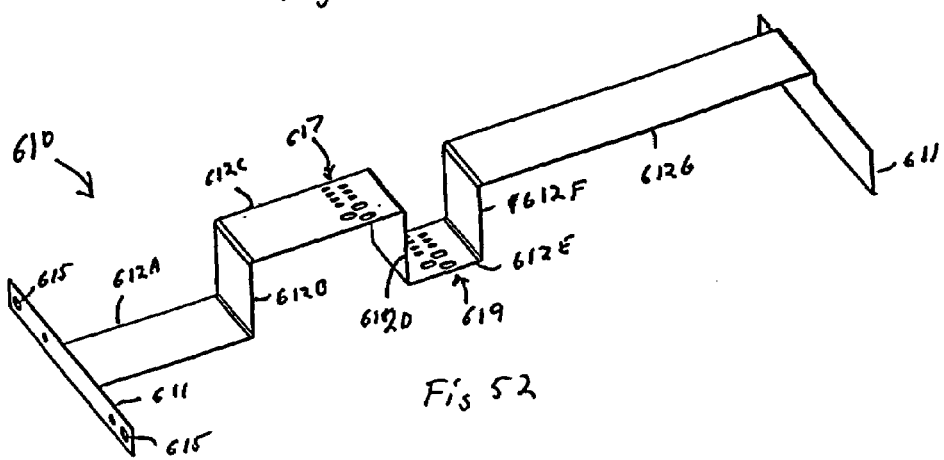
FIG. 52 is a perspective view of a flex circuit of the conduit assembly of FIG. 50.

As best illustrated by FIGS. 51 and 52 the flex circuit 610 is based on a flexible none conducting base material that is folded into sections 612A, 612B, 612C, 612D, 612E and 612F. The base material is chosen for both its electrical and thermal characteristics in particular its thermal conductivity and melting point. At the ends of the flex circuit 611 provision is made for the attachment of connectors 613 through which power and signals are conducted between the EFB and the associated support module. The conductors (not shown) pass through rows of gaps 617 and 619 the purpose of which were previously described in relation to FIGS. 25, 26A, and 26B. Holes 615 are used to attach the flex circuit 610 to the cooling plate 420. The conductors (not shown) pass data and control signals to the drive 410 as well as temperature sensing signals from the sensor 640.

Figure 53:
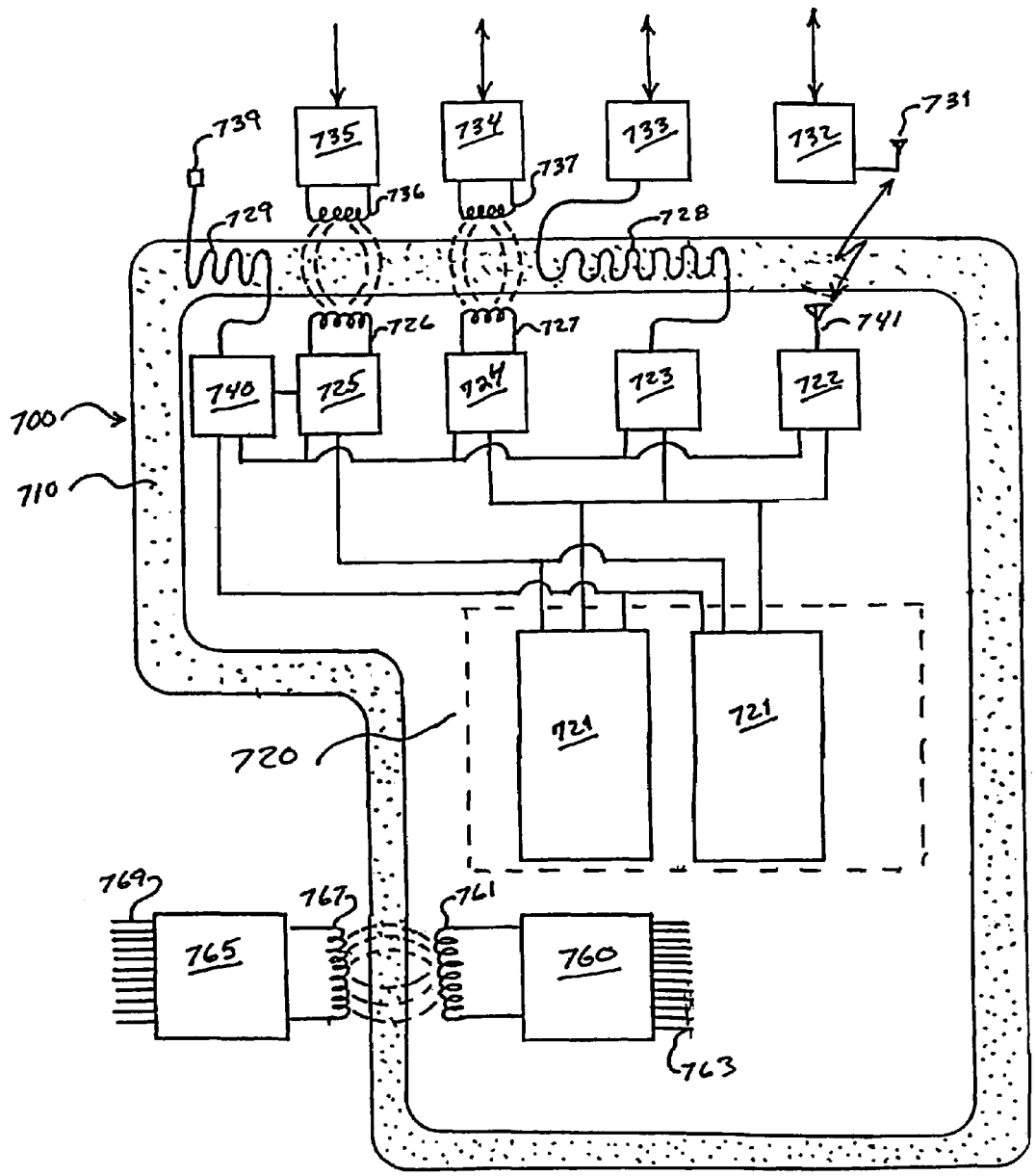
FIG. 53 is a perspective view of an apparatus in accordance with an exemplary embodiment of the invention.

FIG. 53 illustrates an apparatus 700 comprising a low-k shell 710, an internal electronic system 720, and a plurality of external systems 732-735. The system 720 includes a electronic device 721, a radio frequency (RF) modem 722, an optical modem 723, a data modem 724, a power supply 725, an inductor 726, and inductor 727, and optical wave guides 728 and 729. External to the low-k shell 710 are inductors 736 and 737, RF modem 732, optical modem 733, data modem 734, and power supply 735. In many instances it is preferred to utilize methods and apparatus that do not increase thermal conductivity through the low-k shell by providing higher-k paths through conductors used to transfer data, power from outside the low-k shell 710 into system 720. As such, some embodiments will comprise one or more antenna's 731, 741, inductive coils 726, 727, 736, 737 and or conductors positioned within the low-k shell 710, the cavity or the system 720 to transmit or receive electromagnetic energy through the low-k shell 710 via data or power modems 722, 725, 724 which transmit data and or power to their counterparts 732, 734, 735 outside the low-k shell. In some instances it may be possible to effect such transfers using waveguides 728, 729 that pass through the low-k shell 710 that have a thermal conductivity and melting point similar to that of the low-k shell 710 using data and or power modems 723, 740 which transmit data and visual indicators to their counterparts 733, 739 outside the low-k shell. In such instances the waveguides can be left in place even during adverse conditions without having an excessively negative impact on the effectiveness of the low-k shell 710. In other cases the systems 720 operating heat energy from within the low-k shell 710 can be converted or collected, possibly using a heat-sink such as 763, from within the low-k shell and transferred electromagnetically via cooling devices 760, 765 and inductive coils 761, 767 through the low-k shell 710 as electromagnetic energy where they are dissipated as heat via devices such as external heat-sink 769.

It is contemplated that some embodiments will be a small (<3 ft$^3$), low cost (<$500.00), high capacity (>100 GB), lightweight (<25 lb) storage system capable of surviving a residential or commercial fire as defined by one or more national or international fire protection standards. Such a system would minimize it's size and cost by using optical or electromagnetic means to transfer data and power through the low-k encapsulating enclosure. It is further envisioned that future designs will have the capability of extracting operating heat electromagnetically, optically or by other means which do not compromise or reduce the insulating characteristics of the encapsulating low-k shell.

As used herein, terms that might each be interpreted as describing something having a unitary structure should, unless explicitly described as being limited to having a unitary structure (i.e. formed as a single piece such as by casting, molding, etc.), be interpreted as including combinations formed from a plurality of unitary items (i.e. items that each have a unitary structure) and/or sub-combinations. Such terms include but are not necessarily limited to the following: part, piece, element, component, and member. As such, an element (part, piece, etc.) may be a combination of elements and/or sub-combinations.

As used herein, terms that might be interpreted as describing a combination of unitary items and/or sub-combinations should, unless explicitly described as being limited to having a non-unitary structure, be interpreted as including unitary items. Such terms include but are not necessarily limited to the following: assembly, structure, and system. As such, an assembly (structure, etc.) may have a unitary structure.

Any item, whether unitary or non-unitary, may comprise any material or combination of materials unless explicitly limited to a particular material or combination of materials.

It is important to note that simply describing something as having a unitary or non-unitary structure, or as comprising a particular material or combination of materials is not an explicit limitation. To be an explicit limitation, the term "must" or the term "require" (or a variation thereof) must be used such as in the phrase "element A must have a unitary structure", or in the phrase "assembly B is required to be have a non-unitary structure". Any description that appears to be limiting (such as "A is" and "B has"), but is not explicitly limiting (i.e. including the term "must" or the term "require"), should be interpreted as being non-limiting.

The phrases "consisting of" and "consisting essentially of", if used in a claim of the numbered list of claims included herein, should be interpreted as being expressly limiting. The phrase "consisting of" should be interpreted as a closed term that includes any recited elements or steps and excludes any un-recited elements or steps. When the phrase "consists of" appears in a clause of the body of a claim, rather than immediately following the preamble, it limits only the element set forth in that clause; other elements are not excluded from the claim as a whole. For example, a claim to a combination consisting of A+B does not cover the combination A+B+C. In contrast, the term "comprising" (which is synonymous with "including", "having", "containing" and "characterized by") should be interpreted as an open term that includes any recited elements but that does not exclude any un-recited elements. For example, a claim to a combination comprising A+B covers a combination having A+B+C. The phrase "consisting essentially of" should be interpreted as a phrase that is part open and part closed, and that includes any recited elements but excludes additional un-recited elements which would affect the basic and novel characteristic(s) of the claimed apparatus or method. As such, a claim to a combination consisting essentially of A+B would cover a combination of A+B+C if C does not affect the basic and novel characteristic(s) of the claimed apparatus or method.

The embodiments of the present invention described herein comprise multiple novel features with each described embodiment including either a single such feature or a combination of such features. Other contemplated embodiments include all combinations of one or more such novel features not explicitly described herein as such combinations are readily discernable from the embodiments described. In light of the various contemplated embodiments, the present invention can be characterized in a number of ways with the following paragraphs providing examples of some such characterizations.

In an exemplary embodiment of the invention, an apparatus comprises: a very low-k shell having an interior cavity and an exterior surface; an electronic device enclosed within the interior cavity of the shell; and a first energy conduit extending between the interior cavity and the exterior surface, the energy conduit comprising a segment within a wall of the shell; wherein the segment of the first energy conduit within a wall of the shell changes at or after a time when a threshold temperature is met or exceeded in a manner that causes the thermal conductivity of the segment to decrease.

In such an embodiment, the apparatus may comprise and/or satisfy one or more of the following: (a) the first energy conduit is a tube filled with a working fluid flowing into or out of the shell, and the segment of the tube within a wall of the shell changes by burning, melting, or evaporating; (b) the first energy conduit is a metallic electrical conductor, and the segment of the conductor within a wall of the shell changes by burning, melting, or evaporating; (c) the first energy conduit is an optical waveguide, and the segment of the waveguide within a wall of the shell changes by burning, melting, or evaporating; (d) at least a portion of the segment passes through a cavity in the wall wherein the cavity has a volume substantially greater than the portion of the segment passing through the cavity; (e) the cavity has a volume at least twice the volume of the portion of the segment passing through the cavity; (f) a second energy conduit has a segment within a wall of the shell where the segment changes at or after a time when a threshold temperature is met or exceeded in a manner that causes the thermal conductivity of the segment of the second energy conduit to decrease, and at least a portion of the segment of the second energy conduit passes through the cavity in the wall of the shell; (g) the shell is formed from a first material, and the cavity is at least partially lined with a second material that differs from the first material; (h) the second material is paper; (i) the second material is a tube or sphere; (1) the apparatus includes a flex circuit, the flex circuit including a plurality of electrical conductors where one of the plurality of electrical conductors is the first energy conduit; (k) each electrical conductor of the flex circuit comprises a first elongated segment, a second elongated segment, and a first connecting segment electrically connecting the first elongated segment to the second elongated segment, and the first connecting segment has a melting point below that of the first and second elongated segments; (l) each electrical conductor comprises at least three elongated segments, a first connecting segment electrically connecting a first elongated segment and a second elongated segment, and a second connecting segment electrically connecting the second elongated segment and a third elongated segment, and the first and second connecting segments each have a melting point substantially below that of the first, second, and third elongated segments; and (m) at least a portion of the first connecting segment of each of the plurality of electrical conductors is positioned within a first paper tube, and at least a portion of the second connecting segment of each of the plurality of electrical conductors is positioned within a second paper tube.

In another exemplary embodiment of the invention, an apparatus comprises a container including a cavity, the container including a first fiber based material loaded with a second material which endothermically decomposes above a pre-determined temperature T degrees Celsius where T is greater than 150 and less than 500.

In such an embodiment, the apparatus may comprise and/or satisfy one or more of the following: (a) an electronic device within the cavity; (b) T is greater than 200 and less than 400; (c) the first material is loaded with at least 0.1 percent by weight of carbon; (d) the first material is loaded with at least five percent by weight of the second material, and the second material consists essentially of $Mg(OH)_2$ and/or $Ca(OH)_2$; (e) the second material has an enthalpy of decomposition between 250 Cal/g and 400 Cal/g; (f) the fiber based material is an alumina-silica ceramic fiber based material; (g) the first material is bio-soluble; (h) first material is vacuum formable; (i) the distance between a point on an exterior surface of the container and a point on a surface of the cavity that is nearest to the point on the exterior surface is less than W inches for any point on at least thirty percent of the exterior surface, where W is 3.5; (j) W is between 1.5 and 3; (k) the container comprises at least two pieces compressed against each other within a second container; (l) a thermal mass within the cavity in fluid connection with a thermal mass outside the container; (m) a working fluid flowing between the thermal mass within the cavity and the thermal mass outside of the container, and at least two flow paths passing through the container, the at least two flow paths providing a route for the working fluid to flow into the cavity, and providing a route for the working fluid to flow out of the cavity; (n) the thermal mass inside the cavity comprises a plate having a plurality of flow paths within it, and the working fluid flows into, through, and back out of the plurality of plate flow paths; (o) the plate is part of an enclosure within the cavity; (p) open areas within the enclosure are filled with a dry gas that contains less than 0.5% gaseous water by volume; (q) the thermal mass outside the container is actively cooled; (r) the thermal mass outside the container is actively cooled by at least one Peltier cooler sandwiched between a heat-sink and the thermal mass outside the container; (s) the Peltier device maintains the thermal mass outside the container at a temperature below the ambient temperature; (t) the Peltier device is controlled to repeatedly change the temperature of the thermal mass outside the container between a first temperature and a second temperature that are both below ambient temperature; (u) the first temperature is at or slightly above a minimal safe storage temperature of the electronic device, and the second temperature is at or slightly above a minimal safe operating temperature of the electronic device; (v) the electronic device is an electronic storage device; (w) the electronic storage device comprises a rotating storage medium; and (x) the electronic storage device is a disk drive.

In yet another exemplary embodiment of the invention, an apparatus comprises: a very low-k shell; and an electronic device within the shell; wherein the electronic device transmits and/or receives data and/or power signals through the shell using an optical wave guide and/or a time varying electromagnetic field.

In such an embodiment, the apparatus may comprise and/or satisfy one or more of the following: (a) an optical fiber following an arduous path through a wall of the shell; (b) the electronic device transmits and/or receives data through the optical fiber; (c) the electronic device communicates through a wall of the shell using a first inductor on one side of the wall and a second inductor on an opposite side of the wall; (d) the electronic device is part of a system that includes one or more of the following to communicate with a system that is not within the shell: a data modem, an optical modem, and a RF modem; and (e) heat is transferred out of the shell using electromagnetic energy transferred through the shell.

In still another exemplary embodiment of the invention, an apparatus comprises: a very low-k shell; and an electronic device within the shell that utilizes energy obtained from outside the shell; wherein at least a portion of the energy used by the electronic device enters the shell without traveling along an electrical conductor extending between the inside and the outside of the shell.

In another exemplary embodiment of the invention, a flex circuit comprises: a first conductor; a second conductor; and a thermally tuned coupling material electrically connecting the first conductor to the second conductor; wherein the thermally tuned material breaks the electrical connection between the first conductor and the second conductor when a threshold temperature is met or exceeded.

In such an embodiment, the apparatus may comprise and/or satisfy one or more of the following: (a) the apparatus consists essentially of the flex circuit; (b) the apparatus consists of the flex circuit; (c) the apparatus is a plug for an shell; (d) each electrical conductor of the plurality of electrical conductors comprises at least three elongated segments, a first connecting segment electrically connecting a first elongated segment and a second elongated segment, and a second connecting segment electrically connecting the second elongated segment and a third elongated segment, and the first and second connecting segments have a melting point substantially below that of the first, second, and third elongated segments; (e) the first and second connecting circuits of each of the plurality of connectors is molded within a very low-k shell plug; (f) at least some of the first connecting segments have a melting point that differs substantially from the melting point of at least some of the second connecting segments; (g) the flex circuit is elongated and comprises at least two working fluid tubes extending along the flex circuit; and (h) the flex circuit comprises a material at least partially enclosing the at least two working fluid tubes and the plurality of electrical conductors, and the enclosing material forms at least one cavity through which at least two conductors, at least a tube and a conductor, or at least two tubes pass through.

In yet another exemplary embodiment of the invention, an apparatus comprises a flex circuit, the flex circuit including a plurality of electrical conductors where a first of the plurality of electrical conductors comprises at least a first and a second elongated segment, and a first connecting segment wherein the first connecting segment electrically connects the first and second elongated segments, and the first connecting segment has a melting point substantially below that of the first and second elongated segments.

In still another exemplary embodiment of the invention, an apparatus comprises: passive means for interrupting the flow of a working fluid into and out of a low-k shell enclosing an electronic device in response to a change in temperature.

In such an embodiment, the apparatus may comprise and/or satisfy one or more of the following: (a) heat transfer means for transferring heat out of the low-k shell using the working fluid; (b) passive means for interrupting the flow of electricity into and out of the low-k shell; (c) passive means for separating each of a plurality of conductors extending from the outside of the low-k shell into the low-k shell into at least two disconnected conductors; and (d) the passive means for separating each of a plurality of conductors comprises each of the plurality of conductors having an intermediate segment electrically connecting two other segments wherein the intermediate segment has a lower melting point than the two other segments.

What is claimed is:

1. An apparatus comprising:
 a very low-k shell having an interior cavity and an exterior surface;
  wherein the shell comprises an alumina-silica ceramic fiber based material loaded with a second material comprising at least 0.1 percent by weight of carbon, and is also loaded with at least five percent by weight of the second material, further comprising $Mg(OH)_2$ and/or $Ca(OH)_2$ which endothermically decomposes above a pre-determined temperature T degrees Celsius where T is greater than 150 and less than 500;
 an electronic device enclosed within the interior cavity of the shell; and
 a first energy conduit extending between the interior cavity and the exterior surface, the energy conduit comprising a segment within a wall of the shell; wherein
 the segment of the first energy conduit within a wall of the shell changes at or after a time when a threshold temperature is met or exceeded in a manner that causes the thermal conductivity of the segment to decrease.

2. The apparatus of claim 1 wherein:
 the first energy conduit is a tube filled with a working fluid flowing into or out of the shell; and
 the segment of the tube within a wall of the shell changes by burning, melting, or evaporating.

3. The apparatus of claim 1 wherein:
 the first energy conduit is a metallic electrical conductor; and
 the segment of the conductor within a wall of the shell changes by burning, melting, or evaporating.

4. The apparatus of claim 1 wherein
 the first energy conduit is an optical waveguide; and
 the segment of the waveguide within a wall of the shell changes by burning, melting, or evaporating.

5. The apparatus of claim 1 wherein at least a portion of the segment passes through a cavity in the wall wherein the cavity has a volume substantially greater than the portion of the segment passing through the cavity.

6. The apparatus of claim 5 wherein the cavity has a volume at least twice the volume of the portion of the segment passing through the cavity.

7. The apparatus of claim 6 further comprising:
 a second energy conduit having a segment within a wall of the shell where the segment changes at or after a time when a threshold temperature is met or exceeded in a manner that causes the thermal conductivity of the segment of the second energy conduit to decrease; and
 at least a portion of the segment of the second energy conduit passes through the cavity in the wall of the shell.

8. The apparatus of claim 7 wherein the shell is formed from a first material, and the cavity is at least partially lined with a second material that differs from the first material.

9. The apparatus of claim 8 wherein the second material is paper.

10. The apparatus of claim 9 wherein the second material is a tube or sphere.

11. The apparatus of claim 1 comprising a flex circuit, the flex circuit including a plurality of electrical conductors where one of the plurality of electrical conductors is the first energy conduit.

12. The apparatus of claim 11 wherein each electrical conductor of the flex circuit comprises a first elongated segment, a second elongated segment, and a first connecting segment electrically connecting the first elongated segment to the second elongated segment, and the first connecting segment has a melting point below that of the first and second elongated segments.

13. The apparatus of claim 12 wherein each electrical conductor comprises at least three elongated segments, a first connecting segment electrically connecting a first elongated segment and a second elongated segment, and a second connecting segment electrically connecting the second elongated segment and a third elongated segment, and the first and second connecting segments each have a melting point substantially below that of the first, second, and third elongated segments.

14. The apparatus of claim 13 wherein at least a portion of the first connecting segment of each of the plurality of electrical conductors is positioned within a first paper tube, and at least a portion of the second connecting segment of, each of the plurality of electrical conductors is positioned within a second paper tube.

15. The apparatus of claim 1 wherein:
 the electronic device is a disk drive;
 T is greater than 200 and less than 400;
 the first material
  comprises an alumina-silica ceramic fiber based material,
  is loaded with at least 0.1 percent by weight of carbon,
  is also loaded with at least five percent by weight of the second material, and the second material, consisting essentially of $Mg(OH)_2$ and/or $Ca(OH)_2$,
  is bio-soluble,
  is vacuum formable;

the second material has an enthalpy of decomposition between 250 Cal/g and 400 Cal/g;

the distance between a point on an exterior surface of the container and a point on a surface of the cavity that is nearest to the point on the exterior surface is less than W inches for any point on at least thirty percent of the exterior surface, where W is between 1.5 and 3;

the shell comprises at least two pieces compressed against each other within a second container; and the apparatus further comprises a thermal mass within the cavity including a plate that is part of a enclosure within the cavity, the plate having a plurality of flow paths within it, with the thermal mass within the cavity being in fluid connection with an actively cooled thermal mass outside of the shell, with the thermal mass outside the shell being actively cooled by at least one Peltier cooler sandwiched between a heat-sink and the thermal mass outside the container, where the Peltier device maintains the thermal mass outside the container at a temperature below the ambient temperature;

a working fluid flowing between the thermal mass within the cavity and the thermal mass outside of the container with at least two flow paths passing through the container, the at least two flow paths providing a route for the working fluid to flow into the cavity, and providing a route for the working fluid to flow out of the cavity, and the working fluid flows into, through, and back out of the plurality of plate flow paths.

16. The apparatus of claim 1 wherein the electronic device transmits and/or receives data and/or power signals through the shell using an optical wave guide and/or a time varying electromagnetic field.

17. The apparatus of claim 16 further comprising:

an optical fiber following an arduous path through a wall of the shell; wherein electronic device transmits and/or receives data through the optical fiber;

the electronic device communicates and/or receives power through a wall of the shell using a first inductor on one side of the wall and a second inductor on an opposite side of the wall;

the electronic device is part of a system that includes one or more of the following to communicate with a system that is not within the shell: a data modem, an optical modem, and a RF modem; and heat is transferred out of the shell using electromagnetic energy transferred through the shell.

* * * * *